United States Patent
Hinzel et al.

(10) Patent No.: US 6,559,530 B2
(45) Date of Patent: May 6, 2003

(54) METHOD OF INTEGRATING MEMS DEVICE WITH LOW-RESISTIVITY SILICON SUBSTRATES

(75) Inventors: David H. Hinzel, Fairfax, VA (US); Charles L. Goldsmith, Plano, TX (US); Lloyd F. Linder, Agoura Hills, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/956,402

(22) Filed: Sep. 19, 2001

(65) Prior Publication Data
US 2003/0054584 A1 Mar. 20, 2003

(51) Int. Cl.[7] ............... H01L 23/06; H01L 29/84
(52) U.S. Cl. ................ 257/684; 257/415; 257/728
(58) Field of Search .................... 257/684, 728, 257/415

(56) References Cited

U.S. PATENT DOCUMENTS 5,869,896 A * 2/1999 Baker et al. ............... 257/680
5,953,306 A * 9/1999 Yi ............................. 205/306
6,229,404 B1 * 5/2001 Hatanaka ................... 257/698
6,448,622 B1 * 9/2002 Franke et al. .............. 257/414

* cited by examiner

Primary Examiner—Jerome Jackson
(74) Attorney, Agent, or Firm—Leonard A. Alkov; Glenn H. Lenzen, Jr.

(57) ABSTRACT

A method of integrating MEMS devices with non-MEMS circuitry requires fabricating non-MEMS devices on a substrate in a conventional fashion. A thick dielectric layer is deposited on the completed devices, and the MEMS devices fabricated on the dielectric layer. Vias through the dielectric layer interconnect the MEMS devices to the non-MEMS electronics. The interposed dielectric layer allows the common substrate to have characteristics that best suit the non-MEMS components, without degrading the MEMS performance. Another approach involves bonding together two separate wafers—one for the MEMS devices and one for non-MEMS electronics. A package lid, having filled vias formed therethrough, is bonded to the MEMS wafer, sealing the MEMS devices within. The non-MEMS wafer is mounted to the lid, with the vias effecting the necessary interconnections between the two wafers. This enables the MEMS devices and the non-MEMS electronics to function as a single IC, while retaining the established processes associated with each component type.

11 Claims, 2 Drawing Sheets

METHOD OF INTEGRATING MEMS DEVICE WITH LOW-RESISTIVITY SILICON SUBSTRATES

BACKGROUND OF THE INVENTION

1. Field of the Invention

This invention relates to integrated circuit (IC) fabrication methods, and particularly to methods of integrating microelectromechanical system (MEMS) devices with low-resistivity silicon substrates.

2. Description of the Related Art

Microelectromechanical system (MEMS) devices such as MEMS switches have found a wide applicability, due to their very low loss and low power characteristics, as well as their ability to operate at RF frequencies. These characteristics make MEMS devices ideal for use in portable communications equipment. For example, MEMS switches and/or variable capacitors are well-suited for use in digital tunable filters having low-loss and high-Q factors.

Experience with present-day MEMS devices indicates that they perform best when built on a substrate material having a very high resistivity (>10,000 Ω-cm), as substrates having a lower resistivity tend to degrade RF performance. Unfortunately, high resistivity substrates are often not compatible with circuitry which is interconnected to the MEMS devices. For example, the silicon-germanium (SiGe) BiCMOS fabrication process enables major portions of an RF transceiver to be built on a common substrate. However, SiGe is a low-resistivity substrate material, which makes integration with MEMS devices difficult or impractical. This typically results in the SiGe circuitry and the MEMS devices being fabricated independently on separate substrates, which are then packaged together in a hybrid structure. While functional, hybrid packages are typically larger, more expensive, and less reliable than ICs.

SUMMARY OF THE INVENTION

Two methods of integrating MEMS devices with other, non-MEMS circuitry are presented. The methods overcome the problems noted above, providing smaller, cheaper and more reliable devices than were previously possible.

One method, referred to as "direct integration", constructs the MEMS device(s) and the non-MEMS circuitry on a common substrate. Non-MEMS components are fabricated on a substrate in a conventional fashion. A thick dielectric layer, preferably polyimide, is deposited on the completed components, and the MEMS device(s) fabricated on the dielectric layer. The dielectric layer provides the high resistivity needed for superior RF MEMS performance, while the layer's thickness reduces parasitic capacitance and enables low-loss transmission lines to be fabricated. Vias through the dielectric layer interconnect the MEMS devices to the non-MEMS electronics. The presence of the interposed dielectric layer allows the common substrate to have the characteristics that best suit the non-MEMS components, without degrading the MEMS performance.

Another approach, referred to as "wafer level interconnect", involves bonding together two separate wafers—one for the MEMS device(s) and one for the non-MEMS electronics. A package lid is prepared which will encapsulate the MEMS devices; vias are formed through the lid and backfilled with a conductive material. The lid is bonded to the MEMS wafer, and hermetically seals all the MEMS devices on the wafer. The wafer holding the non-MEMS electronics is mounted to the side of the lid opposite the MEMS wafer, with the vias effecting the necessary interconnections between the two wafers. This enables the MEMS devices and the other electronics to function as a single IC, while retaining the established processes associated with each component type.

Further features and advantages of the invention will be apparent to those skilled in the art from the following detailed description, taken together with the accompanying drawings.

BRIEF DESCRIPTION OF THE DRAWINGS

FIG. 1b is a cross-sectional view corresponding to the plan view of FIG. 1a.

FIG. 2b is a cross-sectional view corresponding to the plan view of FIG. 2a.

FIG. 3b is a cross-sectional view corresponding to the plan view of FIG. 3a.

FIG. 4b is a cross-sectional view corresponding to the plan view of FIG. 4a.

DETAILED DESCRIPTION OF THE INVENTION

Figure 1A:
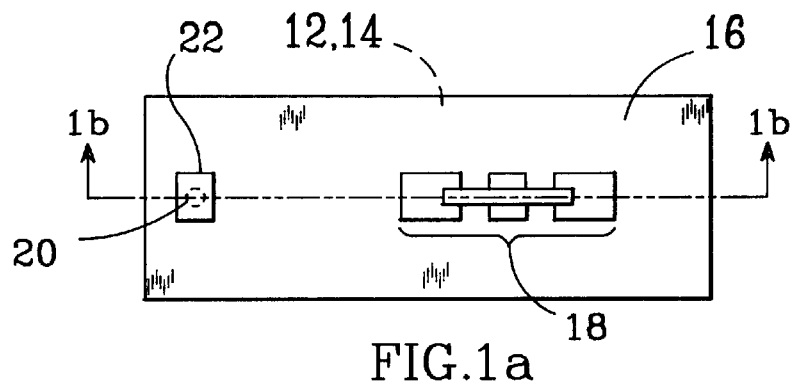
FIG. 1a is a plan view of a MEMS device directly integrated with other devices on a common substrate.
Figure 1B:
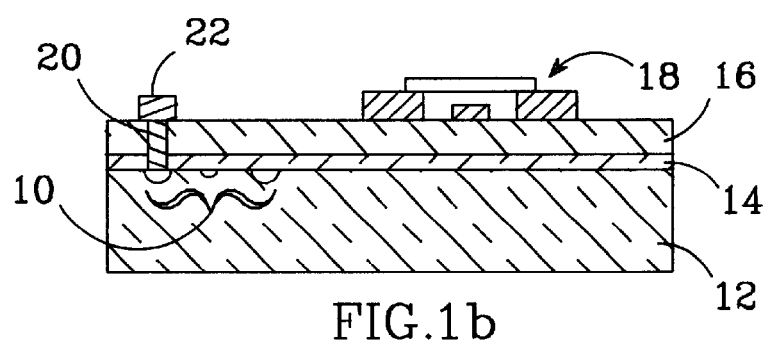

An IC structure which integrates MEMS devices with other, non-MEMS devices on a common substrate is depicted in FIGs. 1a (plan view) and 1b (corresponding cross-sectional view), respectively. As used herein, a "non-MEMS device" is any device, such as a transistor, resistor, capacitor, etc., which does not include a moving member. Such devices are formed on a substrate 12 in a conventional manner.

In accordance with the present invention, one or more MEMS devices are integrated with devices 10 by first depositing a layer of oxide 14 on top of substrate 12 to protect the existing devices. A dielectric layer 16 is deposited on oxide layer 14, on which one or more MEMS devices 18 is formed. To interconnect the MEMS devices with devices 10, vias 20 are formed through dielectric layer 16 and oxide layer 14. Metallization 22 is then deposited, patterned, and etched to fill the vias and provide the necessary interconnections.

The dielectric layer 16 provides several characteristics important to the proper performance of MEMS devices 18. Layer 16 provides a smooth surface, which aids in the proper operation of some types of MEMS devices, such as capacitive membrane switches, due to their device geometries. Dielectric layer 16 also provides a high-resistivity substrate, which, as noted above, is needed for the proper operation of RF MEMS devices. To prevent RF performance degradation, the resistivity of dielectric layer 16 is preferably >10,000 Ω-cm.

Dielectric layer 16 is also preferably thick, i.e., $\geq 15$ μm, and has a dielectric constant k which is $\leq 3$. This enables transmission lines formed on the surface of dielectric layer 16 to be made wide, which reduces parasitic capacitance and makes the lines low-loss. A dielectric layer of, for example, polyimide, can provide the desirable characteristics noted above.

With dielectric layer 16 imposed between non-MEMS devices 10 and MEMS devices 18, substrate 12 can have characteristics which best suit devices 10 without degrading the performance of the MEMS devices. For example, substrate 12 can have a low-resistivity, such as a SiGe substrate (10–20 Ω-cm), which is well-suited to use with high frequency transistors. The use of dielectric layer 16 negates what might otherwise be the adverse affect of a low-resistivity substrate on MEMS devices 18.

Figure 2A:
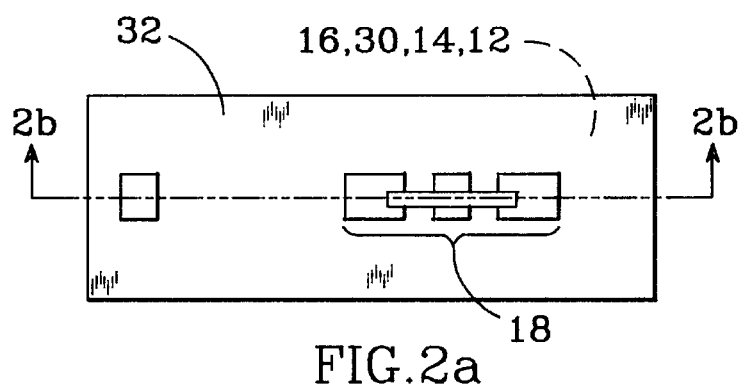
FIG. 2a is a plan view of a preferred direct integration of a MEMS device with other devices on a common substrate.
Figure 2B:
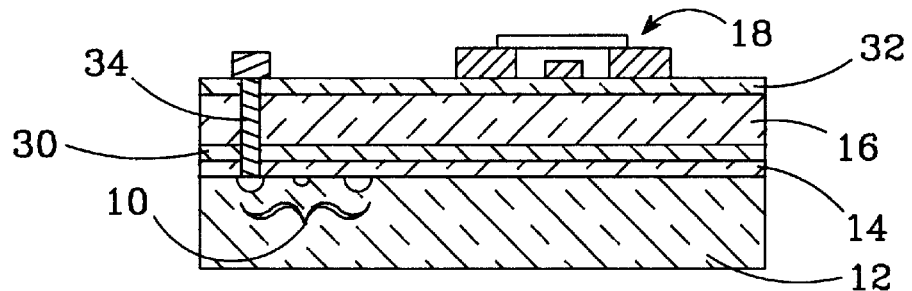

A preferred implementation of a directly integrated structure per the present invention is shown in FIGS. 2a and 2b (plan and corresponding cross-sectional views, respectively). As before, non-MEMS devices 10 are supported by substrate 12, and protected with an oxide layer 14. To support RF MEMS device operation, a metal ground plane layer 30 is fabricated on oxide layer 14. Dielectric layer 16 resides on top of ground plane layer 30, and a layer of oxide 32 is deposited on top of dielectric layer 16 to provide a smooth, planar surface which supports high quality MEMS fabrication.

One or more MEMS devices 18 are fabricated on oxide layer 32, and vias 34 are formed through oxide layers 32 and 14, dielectric layer 16, and ground plane layer 30. Metallization 22 is then deposited, patterned, and etched to fill the vias and provide the necessary interconnections between MEMS devices 18 and non-MEMS devices 10 fabricated on substrate 12. As noted above, dielectric layer 16 is suitably polyimide which is $\geq 15$ μm thick, has a dielectric constant k which is $\leq 3$, and a resistivity of >10,000 Ω-cm.

For best performance, the completed device should be encapsulated within a package that hermetically seals the device inside the package cavity.

Figure 3A:
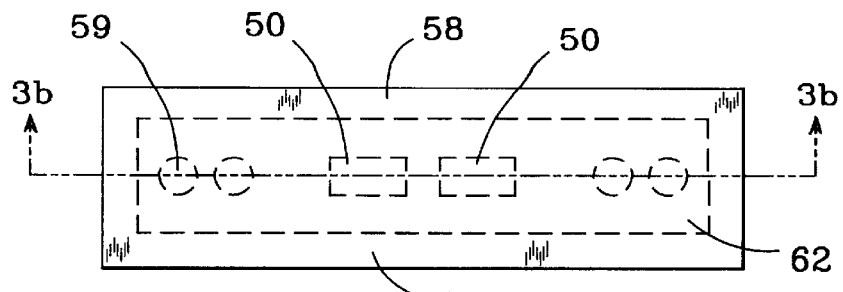
FIG. 3a is a plan view of a device formed by a first method from components fabricated on two different substrates.

Another method of forming a single device which combines MEMS devices and non-MEMS devices is shown in FIGS. 3a (plan view) and 3b (corresponding cross-sectional view). Here, MEMS devices 50 are fabricated on a first substrate 52, through which vias 54 have been formed for connection to, for example, a printed circuit board (PCB) 56. A package lid 58 is prepared which will encapsulate the MEMS devices; vias 59 are formed through the lid and backfilled with a conductive material. Lid 58 has a seal area 60 which contacts substrate 52 and a recessed area 62 where the MEMS devices reside. Lid 58 is bonded to substrate 52, thereby covering and preferably hermetically sealing the MEMS devices within. Vias 59 align with solder bumps 65 on the MEMS substrate to provide interconnections through the lid. The lid is preferably glass, such as Pyrex or quartz, because it has a coefficient of thermal expansion about equal to silicon.

The chemical makeup of glass is well-suited to its use as a lid. The chemical makeup of glass facilitates the anodic bonding of the lid 58 to the substrate 52, as it sets up an electrostatic attraction between the silicon and the lid so that molecular sealing takes place. This is accomplished by, for example, applying a large negative potential to glass lid 58 once it is in contact with substrate 52. The positive sodium ions in the glass are drawn to the large negative potential, creating a strong attraction between the glass and the silicon at the substrate surface.

One or more non-MEMS devices 66, such as high frequency transistors, are fabricated on a second substrate 68. When fabrication of the non-MEMS devices is completed, substrate 68 is bonded to the side of lid 58 opposite substrate 52, preferably using surface mount technology (SMT) techniques. Interconnections between non-MEMS devices 66, MEMS devices 50, and PCB 56 are provided by vias 59 through the lid, vias 54 through substrate 52, and solder bumps or balls as needed. For example, solder balls 70 may be used to bond substrate 68 to lid 58. Solder balls 72 may also be used to attach and interconnect substrate 52 to PCB 56—preferably using SMT techniques—though many other methods are available for attaching a substrate to a PCB.

Lid 58 is prepared by, for example, starting with a glass block having the proper outer dimensions, and etching recessed area 62 from the center of the block. The recessed area is then surrounded by a raised gridwork that is attached to a seal ring on MEMS substrate 52. Attachment is then made by anodic bonding.

This approach allows both the MEMS devices 50 and the non-MEMS devices 66 to be fabricated on their respective preferred substrates. For example, devices 66 may require a low-resistivity substrate such as SiGe for proper operation, and MEMS devices 50 may need a high-resistivity substrate to support RF operation. This is permitted by the present method, which allows each substrate to be independently selected to meet the needs of the devices it will support.

Figure 3B:
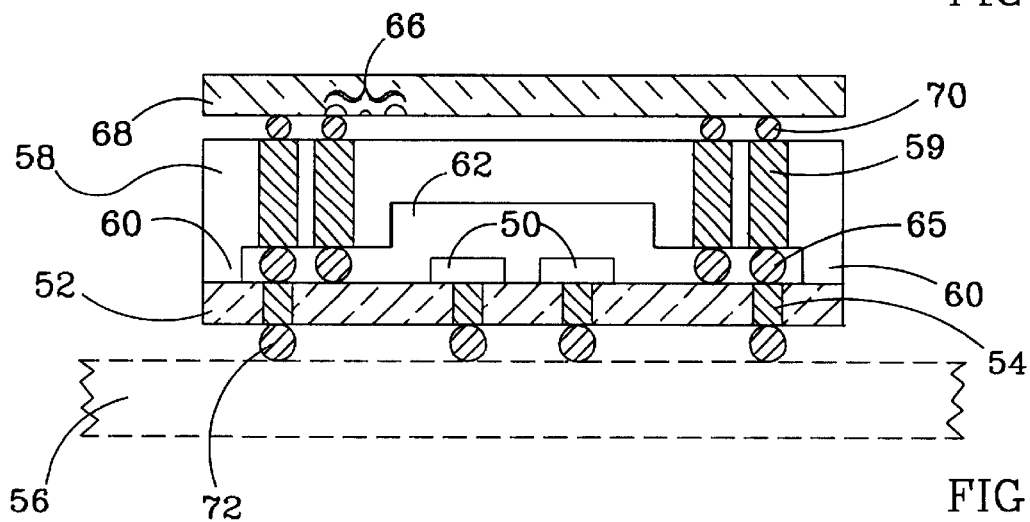
Figure 4A:
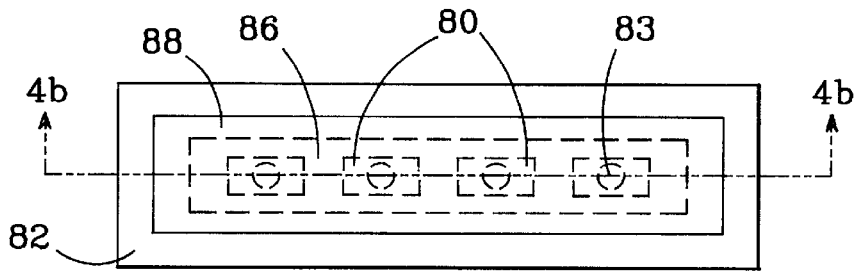
FIG. 4a is a plan view of a device formed by a second method from components fabricated on two different substrates.
Figure 4B:
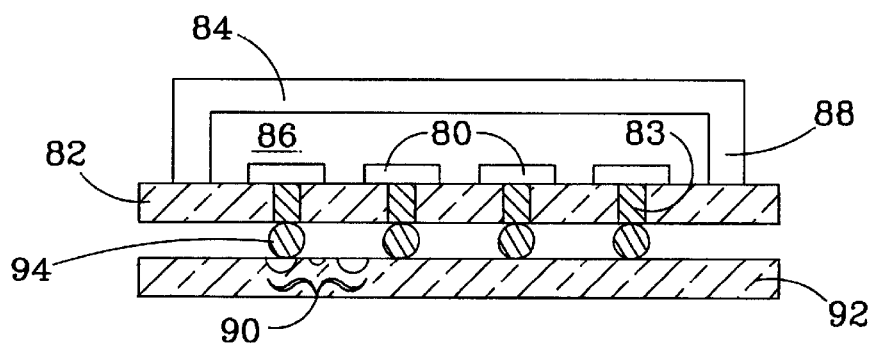

An alternative method of combining two different substrates into a single device is shown in FIGS. 4a (plan view) and 4b (corresponding cross-sectional view). As in FIG. 3, one or more MEMS devices 80 are fabricated on a substrate 82, through which vias 83 are formed. A lid 84, preferably glass, having a recessed area 86 and a seal area 88, is affixed to substrate 82 such that MEMS devices 80 are encapsulated within. As above, lid 84 is preferably anodically bonded to substrate 82, such that a hermetic seal is provided.

One or more non-MEMS devices 90 are fabricated on a second substrate 92. Here, however, rather than mount substrate 92 to the opposite side of lid 84, substrate 92 is flipped over and affixed directly to the bottom of substrate 82 using, for example, solder balls 94. Interconnection points on substrate 92 are aligned with vias 83, so that interconnections between MEMS devices 80 and non-MEMS devices 90 are made using the vias.

As with the approach shown in FIG. 3, this approach allows the MEMS devices 80 and the non-MEMS devices 90 to be fabricated on their respective preferred substrates, such as a low-resistivity substrate (e.g., SiGe) for non-MEMS devices 90, and a high-resistivity substrate for the MEMS devices. Each substrate may be independently selected to meet the needs of the devices it will support.

Please note that, while FIGS. 1–4 depict the integration of one MEMS device with one non-MEMS device, the invention would typically be employed to combine numerous MEMS and non-MEMS devices into a single device.

While particular embodiments of the invention have been shown and described, numerous variations and alternate embodiments will occur to those skilled in the art. Accordingly, it is intended that the invention be limited only in terms of the appended claims.

We claim:

1. A device which includes microelectromechanical system (MEMS) devices and non-MEMS devices fabricated on respective substrates, comprising:
   a first substrate on which at least one MEMS device is fabricated, a lid bonded to said first substrate which encapsulates said MEMS devices, at least one via through said lid, each of said vias filled with a conductive material, and a second substrate on which at least one non-MEMS device is fabricated, said second substrate bonded to the side of said lid opposite said first substrate such that at least one of said MEMS devices is interconnected to at least one of said devices on said second substrate via at least one of said vias.

2. The device of claim 1, wherein said lid is glass.

3. The device of claim 1, wherein said lid is anodically bonded to said first substrate.

4. The device of claim 1, wherein said lid hermetically seals said MEMS devices.

5. The device of claim 1, wherein said first substrate has a resistivity of >10,000 Ω-cm.

6. The device of claim 1, wherein said second substrate comprises silicon-germanium (SiGe).

7. The device of claim 1, wherein said first substrate further comprises vias filled with a conductive material such that, when said device is mounted to a printed circuit board (PCB), said vias through said first substrate interconnect said device to said PCB.

8. A device which includes microelectromechanical system (MEMS) devices and non-MEMS devices fabricated on respective substrates, comprising:

a high-resistivity substrate on which at least one MEMS device is fabricated and which includes at least one via therethrough, said at least one via filled with a conductive material, a glass lid anodically bonded to said first substrate which hermetically seals said MEMS devices, at least one via through said lid, each of said vias backfilled with a conductive material, and a low-resistivity substrate on which at least one non-MEMS device is fabricated, said low-resistivity substrate bonded to the side of said lid opposite said high-resistivity substrate such that at least one of said MEMS devices is interconnected to at least one of said non-MEMS devices on said high-resistivity second substrate via at least one of said vias.

9. The device of claim 8, wherein said low-resistivity substrate comprises silicon-germanium (SiGe).

10. The device of claim 8, wherein said high-resistivity substrate has a resistivity of >10,000 Ω-cm.

11. The device of claim 8, further comprising a printed circuit board (PCB), said device mounted to said PCB such that said at least one via through said first substrate interconnects said device to said PCB.

* * * * *